(12) United States Patent
Saito et al.

(10) Patent No.: US 11,545,386 B2
(45) Date of Patent: Jan. 3, 2023

(54) WORKPIECE UNIT

(71) Applicant: DISCO CORPORATION, Tokyo (JP)

(72) Inventors: Yoshinobu Saito, Tokyo (JP); Masayuki Matsubara, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 335 days.

(21) Appl. No.: 16/740,683

(22) Filed: Jan. 13, 2020

(65) Prior Publication Data

US 2020/0227303 A1 Jul. 16, 2020

(30) Foreign Application Priority Data

Jan. 15, 2019 (JP) .............................. JP2019-004440

(51) Int. Cl.
| | |
|---|---|
| *H01L 21/00* | (2006.01) |
| *H01L 21/683* | (2006.01) |
| *H01L 21/67* | (2006.01) |
| *G01J 1/50* | (2006.01) |

(Continued)

(52) U.S. Cl.
CPC ............ *H01L 21/6836* (2013.01); *G01J 1/50* (2013.01); *G01K 11/12* (2013.01); *H01L 21/67253* (2013.01); *H01J 37/3244* (2013.01); *H01J 37/32183* (2013.01); *H01J 37/32724* (2013.01); *H01J 37/32834* (2013.01); *H01J 2237/3341* (2013.01); *H01L 21/67069* (2013.01); *H01L 21/6833* (2013.01); *H01L 2221/68327* (2013.01); *H01L 2221/68381* (2013.01)

(58) Field of Classification Search
CPC ........... H01L 21/67132; H01L 21/6836; H01L 21/67294; H01L 21/67115; H01L 21/67253; H01L 21/67092; H01L 21/67069; H01L 21/6833; H01L 2221/68381; H01L 2221/6839; H01L 2221/68327; H01J 37/3244; H01J 37/32183; H01J 37/32834; H01J 37/32724; H01J 2237/3341; G01J 1/50; G01K 11/12

See application file for complete search history.

(56) References Cited

U.S. PATENT DOCUMENTS

| | | | |
|---|---|---|---|
| 7,718,343 B2 * | 5/2010 | Taguchi ................ | G03F 7/0392 430/281.1 |
| 10,668,569 B2 * | 6/2020 | Odanaka ............ | B23K 26/0853 |

(Continued)

FOREIGN PATENT DOCUMENTS

| | | | | |
|---|---|---|---|---|
| JP | 2005274801 | * | 10/2005 | ............... C09K 3/00 |
| JP | 2018074082 A | | 5/2018 | |

*Primary Examiner* — Nikolay K Yushin
(74) *Attorney, Agent, or Firm* — Greer Burns & Crain, Ltd.

(57) ABSTRACT

A workpiece unit that includes a workpiece, a tape stuck to the workpiece; and an annular frame to which an outer circumferential edge of the tape is stuck and which has an opening defined centrally therein. The workpiece is disposed in the opening in the annular frame and supported on the annular frame by the tape, and at least one of the tape and the annular frame has an irreversible discoloring section that discolors in response to an external stimulus. Such a configuration makes it possible to determine whether or not a process involving an external stimulus has been carried out on the workpiece unit, based on the appearance of the workpiece unit (i.e., based on whether the irreversible discoloring section has been discolored or not).

14 Claims, 10 Drawing Sheets

(51) Int. Cl.
*G01K 11/12* (2021.01)
*H01J 37/32* (2006.01)

(56) References Cited

U.S. PATENT DOCUMENTS

2008/0070154 A1* 3/2008 Taguchi .............. G03F 7/0392
 430/270.1
2016/0332260 A1* 11/2016 Odanaka .............. B23K 26/032
2018/0127619 A1* 5/2018 Takeuchi ............. H01B 7/0045

* cited by examiner

WORKPIECE UNIT

BACKGROUND OF THE INVENTION

Field of the Invention

The present invention relates to a workpiece unit having at least a workpiece and a tape stuck to the workpiece.

Description of the Related Art

Generally, there has been known in the art a workpiece unit including a plate-shaped workpiece such as a semiconductor wafer, a tape stuck to the workpiece, and an annular frame to which an outer circumferential edge of the tape is stuck and which has an opening defined centrally therein. The workpiece unit uses, as the tape, an ultraviolet (UV) tape whose adhesive power is lowered when irradiated with an ultraviolet radiation, i.e., an external stimulus. The workpiece that is fixed to the annular frame by the UV tape is diced or cut into device chips by a cutting blade. After the dicing process, the workpiece unit is irradiated with the ultraviolet radiation, and then introduced into a pickup apparatus in which the device chips are picked up (see, for example, JP 2018-074082A).

SUMMARY OF THE INVENTION

It is impossible for the worker to decide whether or not the workpiece unit has been irradiated with the ultraviolet radiation from the appearance of the workpiece unit. Therefore, it may occur that the workpiece unit not irradiated with the ultraviolet radiation may be introduced into the pickup apparatus on account of a lack of care on the part of the worker. If the workpiece unit is not irradiated with the ultraviolet radiation, then since the adhesive power of the UV tape is not lowered, the device chips may not be peeled off from the UV tape and may possibly be damaged.

It is therefore an object of the present invention to provide a workpiece unit that makes it possible to decide whether or not a process involving an external stimulus has been carried out on the workpiece unit, from the appearance of the workpiece unit.

In accordance with an aspect of the present invention, there is provided a workpiece unit including a workpiece, a tape stuck to the workpiece, and an annular frame to which an outer circumferential edge of the tape is stuck and which has an opening defined centrally therein, the workpiece being disposed in the opening in the annular frame and supported on the annular frame by the tape. At least one of the tape and the annular frame has an irreversible discoloring section that discolors in response to an external stimulus.

With this arrangement, since at least one of the tape and the annular frame has an irreversible discoloring section that discolors in response to an external stimulus, it can easily be decided whether or not a process that involves the external stimulus has been performed on the workpiece unit from the appearance thereof. Consequently, it is possible to prevent problems from occurring that would be caused if the workpiece were sent unprocessed to a next step.

In accordance with another aspect of the present invention, there is provided a workpiece unit including a workpiece and a tape stuck to the workpiece. The tape has an irreversible discoloring section that discolors in response to an external stimulus.

With this arrangement, since the tape has an irreversible discoloring section that discolors in response to an external stimulus, it can easily be decided whether or not a process that involves the external stimulus has been performed on the workpiece unit from the appearance thereof. Consequently, it is possible to prevent problems from occurring that would be caused if the workpiece were sent unprocessed to a next step.

In the above arrangement, the tape may discolor in its entirety in response to the external stimulus. The tape may include a base member and a glue layer, and the glue layer may be hardened when irradiated with an ultraviolet radiation as the external stimulus. Alternatively, the external stimulus may be a temperature change.

The external stimulus may be a temperature change, and the discoloring section may discolor to a first color at a first temperature and discolor to a second color different from the first color at a second temperature different from the first temperature.

According to the present invention, inasmuch as at least one of the tape and the annular frame has an irreversible discoloring section that discolors in response to an external stimulus, it can easily be decided whether or not a process that involves the external stimulus has been performed on the workpiece unit from the appearance thereof.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Preferred embodiments according to the present invention will be described in detail below with reference to the drawings. The present invention is not limited to the details of the embodiments described below. The components described below cover those which could easily be envisaged by those skilled in the art and those which are essentially identical to those described above. Furthermore, the arrangements described below can be used in appropriate combinations. Various omissions, replacements, or changes of the arrangements may be made without departing from the scope of the present invention.

First Embodiment

Figure 1:
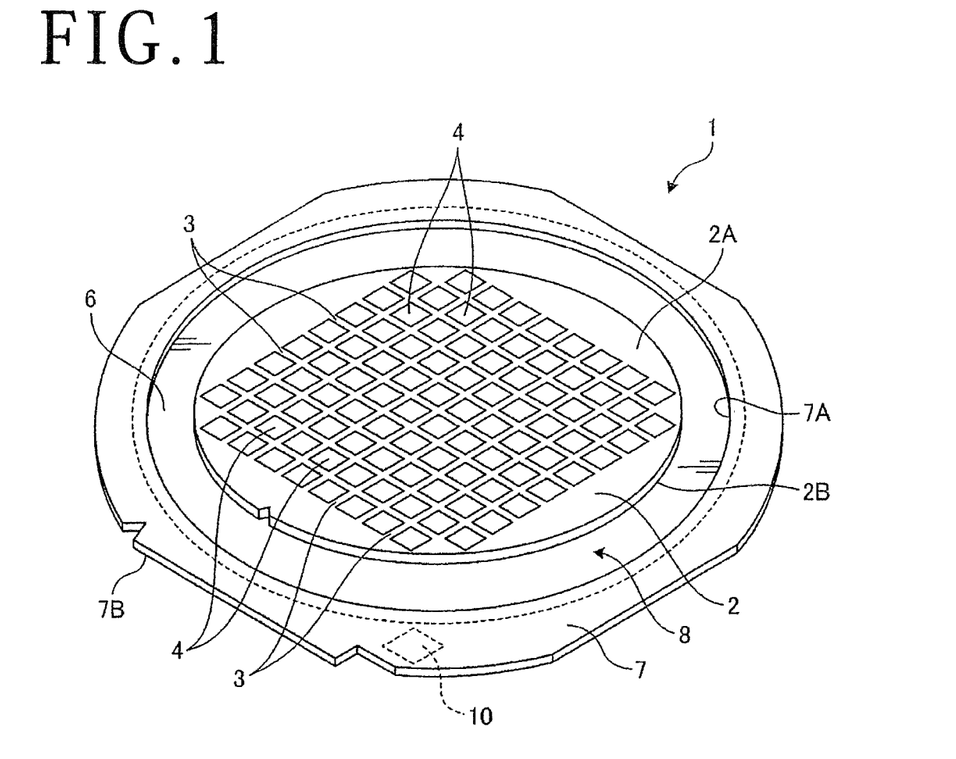
FIG. 1 is a perspective view illustrating, by way of example, the structure of a workpiece unit according to a first embodiment of the present invention.
Figure 2:
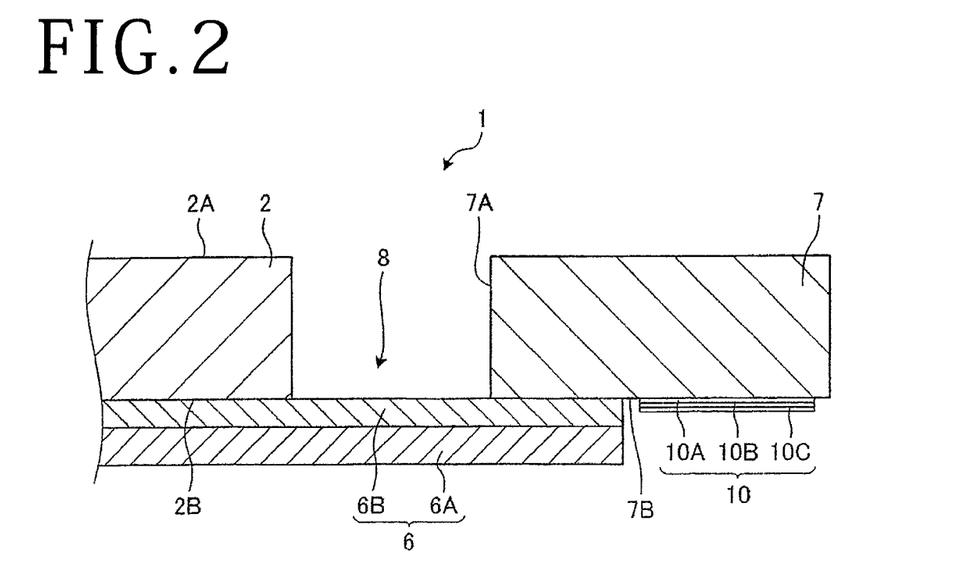
FIG. 2 is a fragmentary cross-sectional view of the workpiece unit.

FIG. 1 illustrates, in perspective, by way of example, the structure of a workpiece unit according to a first embodiment of the present invention. FIG. 2 illustrates the workpiece unit in fragmentary cross section. As illustrated in FIG. 1, a workpiece unit, denoted by 1, includes a wafer 2 as a workpiece, a tape 6 stuck to the wafer 2, and an annular frame 7 to which an outer circumferential edge of the tape 6 is stuck and which has an opening 7A defined centrally therein. The wafer 2 is in the form of a circular plate-shaped semiconductor wafer made of silicon as a base material or an optical device wafer made of sapphire, silicon carbide (SiC), or the like as a base material. The wafer 2 has a plurality of devices 4 formed in respective areas demarcated by a grid of projected dicing lines 3, i.e., lines along which the wafer 2 is to be cut, on a face side 2A thereof. According to the present embodiment, the circular plate-shaped wafer is illustrated as the workpiece. However, a workpiece is not limited to a wafer, but may be a rectangular plate-shaped package substrate, ceramics substrate, glass substrate, or the like.

As illustrated in FIG. 2, the tape 6 is a dicing tape, for example, that has a base member 6A made of synthetic resin and an adhesive layer, i.e., glue layer, 6B stacked on the base member 6A. The adhesive layer 6B is made of an adhesive material which is hardened when irradiated with an ultraviolet radiation having a predetermined wavelength in the range of 300 to 400 nm, thereby reducing its adhesive power. The tape 6 has its adhesive layer 6B facing upwardly and is stuck to a reverse side 2B of the wafer 2.

The opening 7A in the annular frame 7 is larger in diameter than the wafer 2. The wafer 2 is placed in the opening 7A and held on the annular frame 7 by the tape 6. An annular region of the adhesive layer 6B of the tape 6 is exposed in an annular area 8 between the outer circumferential edge of the wafer 2 and the inner circumferential edge of the annular frame 7. The annular frame 7 has a reverse side 7B including a portion to which an ultraviolet radiation detecting seal, i.e., discoloring section, 10 is stuck. The ultraviolet radiation detecting seal 10 irreversibly discolors when irradiated with the ultraviolet radiation having the wavelength ranging from 300 to 400 nm that hardens the adhesive layer 6B of the tape 6. The ultraviolet radiation detecting seal 10 includes an adhesive layer 10A, a base layer 10B, and a discoloring layer 10C that are stacked together, for example. The adhesive layer 10A is stuck to the reverse side 7B of the annular frame 7. The discoloring layer 10C as the discoloring section contains an ultraviolet ink that discolors from a colorless state to a colored state when irradiated with the ultraviolet radiation.

The discoloring layer 100 may be formed by coating the base layer 10B with the ultraviolet ink. The discoloring of the ultraviolet ink is irreversible and hence the color developed by the ultraviolet ink when it has discolored cannot be undone. Therefore, the worker can easily decide whether or not the workpiece unit 1 has been irradiated with the ultraviolet radiation from the appearance of the workpiece unit 1 by observing whether or not the ultraviolet radiation detecting seal 10 has discolored. According to the present embodiment, the ultraviolet radiation detecting seal 10 discolors from the colorless state to the colored state when irradiated with the ultraviolet radiation. However, insofar as a color developed by the discoloring layer 100 when it discolors is known in advance, the discoloring layer 100 may discolor from one color to another different color. A discoloring section is not limited to the ultraviolet radiation detecting seal 10, but may be an ultraviolet ink applied partly or entirely to the reverse side 7B of the annular frame 7. In such a case, the ultraviolet ink used should preferably be removable easily from the annular frame 7 by a solvent or the like.

Figure 3:
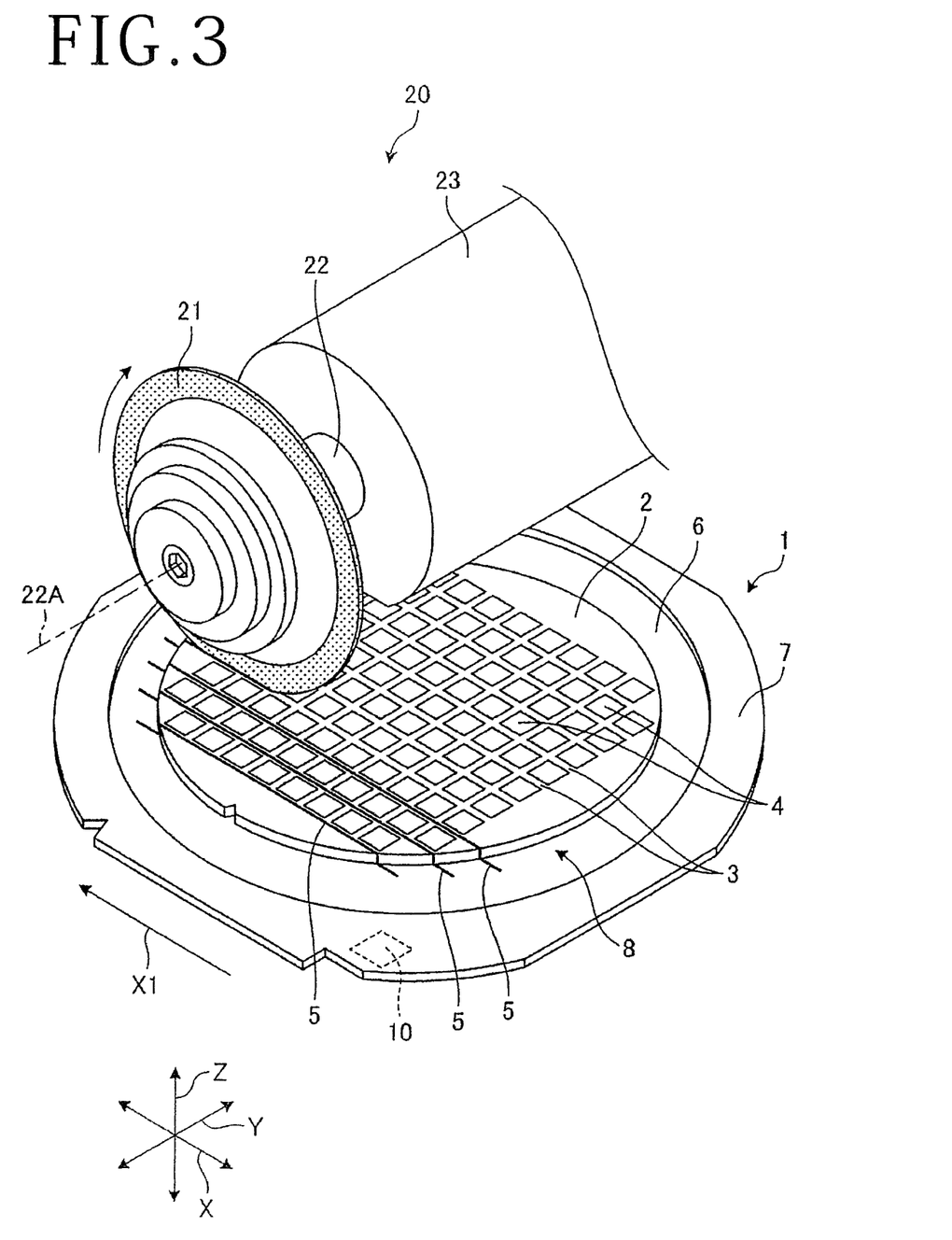
FIG. 3 is a perspective view illustrating a step of cutting a workpiece of the workpiece unit.
Figure 4:
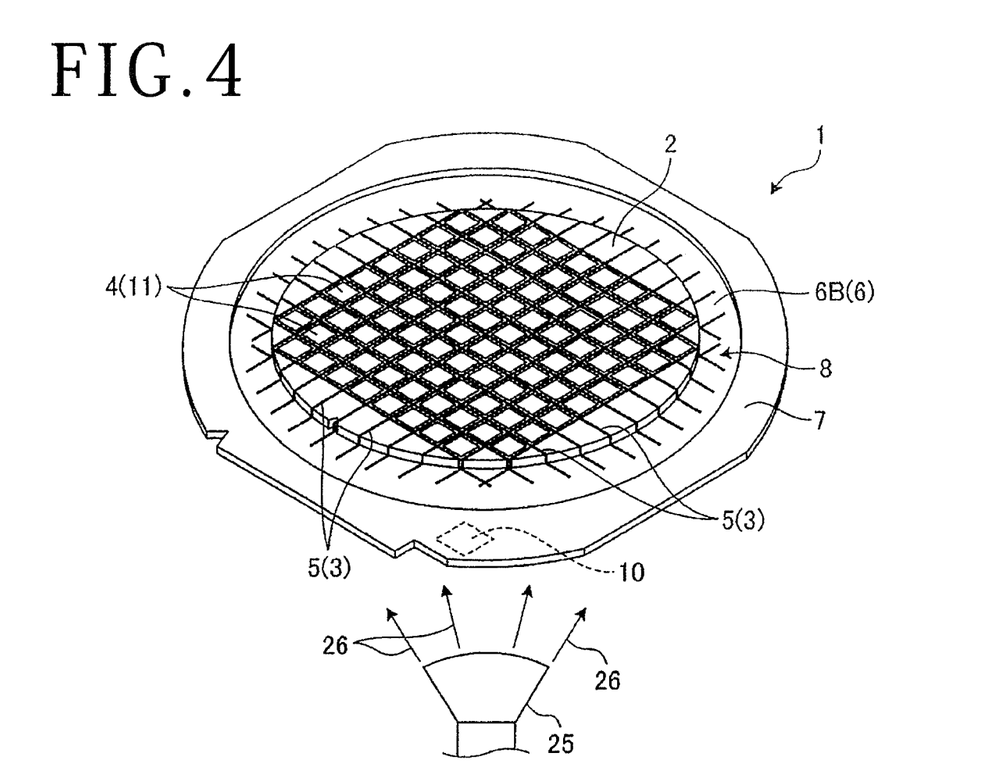
FIG. 4 is a perspective view illustrating a step of irradiating the workpiece unit with an ultraviolet radiation.
Figure 5:
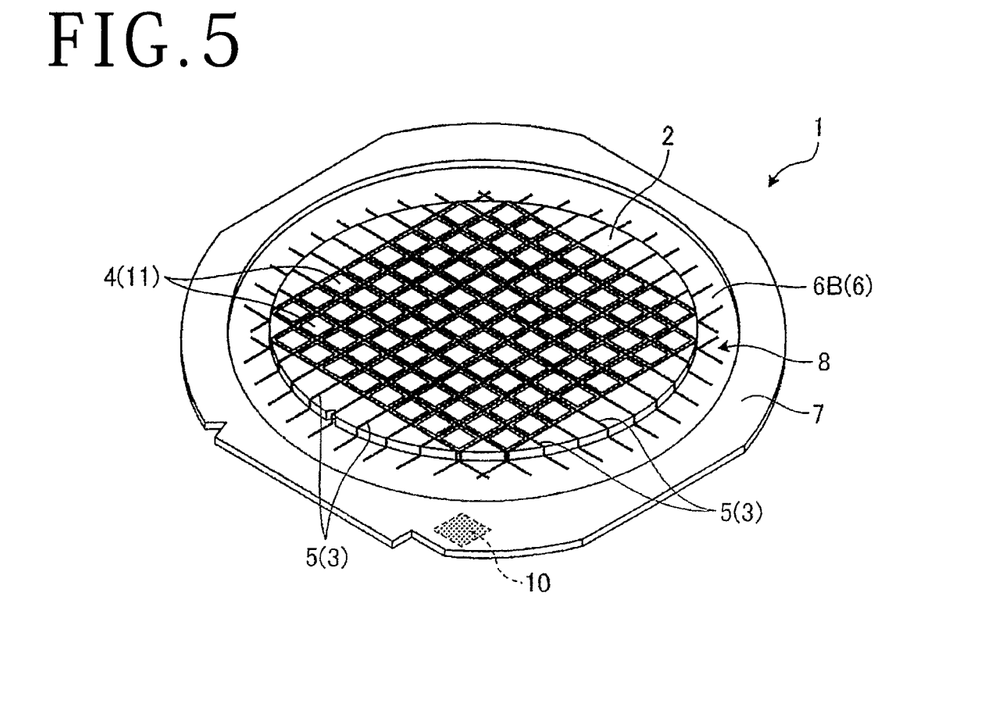
FIG. 5 is a perspective view illustrating the workpiece unit that has been irradiated with the ultraviolet radiation.

A sequence of processing the workpiece unit 1 with the ultraviolet radiation detecting seal 10 stuck to the annular frame 7 will be described below. FIG. 3 illustrates in perspective a step of cutting a workpiece of the workpiece unit 1. FIG. 4 illustrates in perspective a step of irradiating the workpiece unit 1 with an ultraviolet radiation. FIG. 5 illustrates in perspective the workpiece unit 1 that has been irradiated with the ultraviolet radiation. As illustrated in FIG. 3, the workpiece unit 1 is cut or processed using a cutting blade 21 of a cutting unit 20. The cutting unit 20 includes the cutting blade 21, a spindle 22, and a housing 23.

The cutting blade 21 has an annular cutting edge 21A for cutting the wafer 2. The cutting edge 21A is made of abrasive grains of diamond, cubic boron nitride (CBN), or the like and a bonding material or binder including metal, resin, or the like, for example. The spindle 22 rotates the cutting blade 21 about its own axis to cause the cutting edge 21A to cut the wafer 2. The spindle 22 has a rotational axis 22A extending parallel to predetermined Y directions. The cutting blade 21 and a mount flange, not illustrated, are sandwiched and secured in position between the distal end of the spindle 22 and a mounting nut 24. The housing 23 houses therein the spindle 22 and an electric motor, not illustrated, for rotating the spindle 22. The housing 23 is coupled to a moving unit, not illustrated, that is movable in the directions along which the rotational axis 22A of the spindle 22 extends, i.e., the Y directions, and vertical directions, i.e., Z directions, perpendicular to the directions along which the rotational axis 22A of the spindle 22 extends.

The workpiece unit 1 is held on a chuck table, not illustrated. The chuck table is movable along processing-feed directions, i.e., X directions, perpendicular to both the directions along which the rotational axis 22A of the spindle 22 extends, i.e., the Y directions, and the vertical directions, i.e., the Z directions. The chuck table is also rotatable about its own axis parallel to the vertical directions. According to the present embodiment, the chuck table for holding the workpiece unit 1 thereon is movable along the X directions.

However, the cutting unit 20 may be movable along the X directions insofar as it is movable relatively to the workpiece unit 1 along the X directions.

For cutting the wafer 2 of the workpiece unit 1, while the cutting blade 21 of the cutting unit 20 is being rotated, the chuck table is processing-fed in an X1 direction to cause the cutting blade 21 to cut the wafer 2 along one of the projected dicing lines 3 to form a cut groove, i.e., a fully cut groove, 5 in the wafer 2. When cut grooves 5 have been formed in the wafer 2 along all the projected dicing lines 3, dividing the wafer 2 into device chips 11, as illustrated in FIG. 4, the step of cutting the workpiece is finished. At this time, the device chips 11 remain stuck to the adhesive layer 6B of the tape 6.

Then, the adhesive layer 6B of the tape 6 is hardened to lower the adhesive power of the adhesive layer 6B. The adhesive layer 6B according to the present embodiment is hardened when irradiated with an ultraviolet radiation. As illustrated in FIG. 4, an ultraviolet radiation applying lamp 25 that is disposed below the workpiece unit 1 applies an ultraviolet radiation 26 to the workpiece unit 1. The adhesive layer 6B of the tape 6 is now hardened, lowering the adhesive power on the device chips 11.

According to the present embodiment, the ultraviolet radiation detecting seal 10 stuck to the portion of the reverse side 7B of the annular frame 7 discolors when irradiated with an ultraviolet radiation, i.e., an external stimulus, as illustrated in FIG. 5. Therefore, the worker can easily decide whether or not the workpiece unit 1 has been irradiated with the ultraviolet radiation from the appearance of the workpiece unit 1 by observing whether or not the ultraviolet radiation detecting seal 10 has discolored. If the ultraviolet radiation detecting seal 10 has discolored, then the worker can decide that the workpiece unit 1 has been irradiated with the ultraviolet radiation, i.e., processed by the external stimulus, and the adhesive power of the adhesive layer 6B has been lowered. The worker can now introduce the workpiece unit 1 into a pickup apparatus, not illustrated, and the pickup apparatus will easily remove the device chips 11 divided from the wafer 2 from the tape 6.

On the other hand, if the ultraviolet radiation detecting seal 10 has not discolored, then the worker can decide that the workpiece unit 1 has not been irradiated with the ultraviolet radiation, i.e., not processed by the external stimulus, and the adhesive power of the adhesive layer 6B has not been lowered. The worker is prevented from introducing the workpiece unit 1 into the pickup apparatus, not illustrated, and the pickup apparatus will be prevented from breaking the device chips 11 as they remain stuck to the tape 6.

Next, modifications of the first embodiment will be described below. According to the first embodiment, the ultraviolet radiation detecting seal 10 as a discoloring section that irreversibly discolors when irradiated with an ultraviolet radiation, i.e., an external stimulus, is stuck to the annular frame 7. However, a discoloring section may be incorporated in the tape 6. Specifically, an ultraviolet ink or pigment that irreversibly discolors when irradiated with an ultraviolet radiation, i.e., an external stimulus, is mixed with the adhesive layer 6B of the tape 6, thereby allowing the adhesive layer 6B to function as a discoloring section. Alternatively, a discoloring layer, i.e., discoloring section that contains the ultraviolet ink may be interposed between the base member 6A and the adhesive layer 6B. Further alternatively, the base member 6A may contain an ultraviolet ink or a pigment, thereby functioning as a discoloring section. According to the last-mentioned modification, since mainly the annular area 8 of the tape 6 discolors when irradiated with an ultraviolet radiation, i.e., an external stimulus, the worker can easily decide whether or not the workpiece unit 1 has been irradiated with the ultraviolet radiation from the appearance of the workpiece unit 1 by observing whether or not the tape 6 has discolored.

Figure 6:
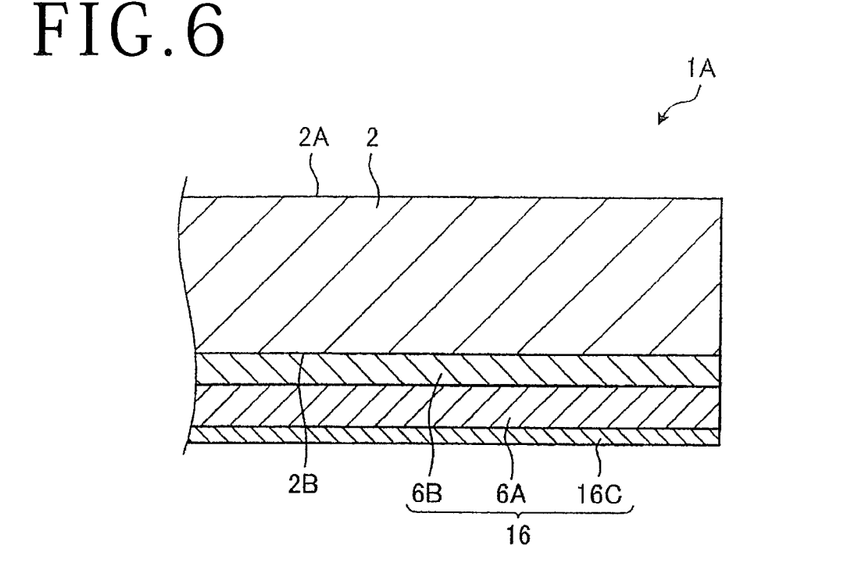
FIG. 6 is a fragmentary cross-sectional view of a workpiece unit according to a modification of the first embodiment.

According to the first embodiment, the workpiece unit 1 includes the wafer 2, the tape 6, and the annular frame 7. According to a modification illustrated in FIG. 6, a workpiece unit 1A includes the wafer 2 and a tape 16. The tape 16 is of a size substantially equivalent to the wafer 2 and is stuck to the reverse side 2B of the wafer 2. The tape 16 has the base member 6A and the adhesive layer 6B referred to above and also has a discoloring layer, i.e., discoloring section, 16C stacked on a lower surface of the base member 6A. The discoloring layer 16C contains the ultraviolet ink referred to above. Since the tape 16 is of a size substantially equivalent to the wafer 2, the adhesive layer 6B is not exposed. As the discoloring layer 16C is disposed on the lower surface of the base member 6A, when the workpiece unit 1A is irradiated with an ultraviolet radiation, i.e., an external stimulus, the lower surface of the tape 16 discolors. Therefore, the worker can easily decide whether or not the workpiece unit 1A has been irradiated with the ultraviolet radiation from the appearance of the workpiece unit 1A by observing whether or not the tape 6 has discolored.

Second Embodiment

Figure 7:
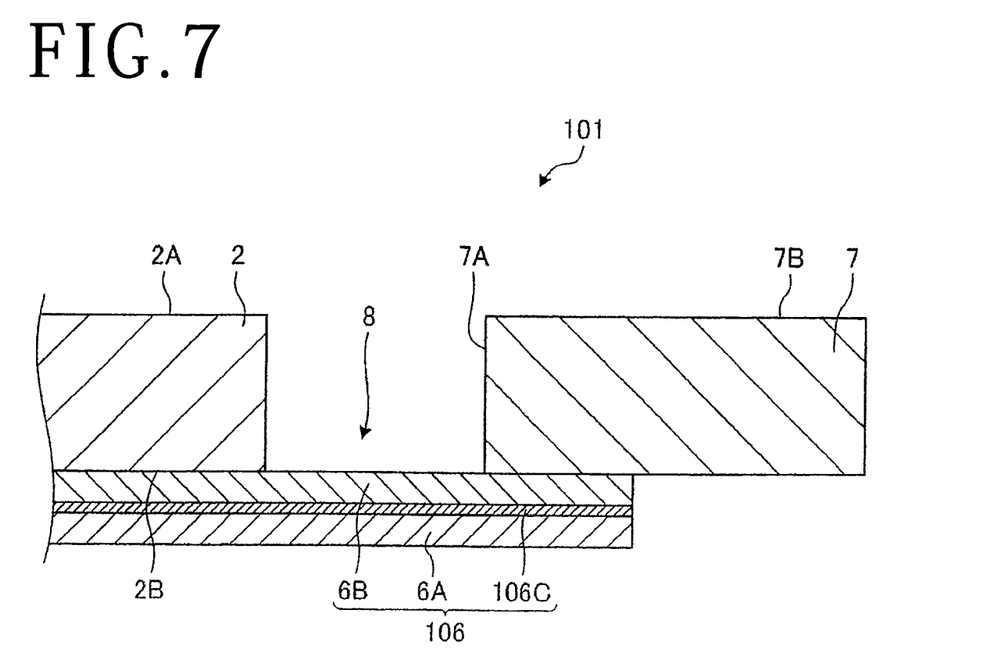
FIG. 7 is a fragmentary cross-sectional view of a workpiece unit according to a second embodiment of the present invention.

According to the first embodiment, the workpiece unit is irradiated with an ultraviolet radiation as an external stimulus. According to a second embodiment, a workpiece unit 1 includes a discoloring section that irreversibly discolors in response to a temperature change, i.e., when placed in a heated environment at a predetermined temperature or higher. FIG. 7 illustrates in fragmentary cross section a workpiece unit 101 according to the second embodiment of the present invention. Those parts of the workpiece unit 101 which are identical to those of the workpiece unit 1 according to the first embodiment are denoted by identical reference characters, and will not be described in detail below.

The workpiece unit 101 according to the second embodiment includes a tape 106 stuck to the wafer 2 and supporting the wafer 2 on the annular frame 7. The tape 106 includes a base member 6A made of synthetic resin, a transparent adhesive layer, i.e., glue layer, 6B stacked over an upper surface of the base member 6A, and a discoloring layer, i.e., discoloring section, 106C disposed between the base member 6A and the adhesive layer 6B. The discoloring layer 106C includes a temperature indicating ink that discolors from a colorless state to a colored state in response to a temperature change, i.e., an external stimulus, when heated to a predetermined temperature, e.g., 35° C., or higher. The temperature indicating ink irreversibly discolors and hence the color developed by the temperature indicating ink when it has discolored cannot be undone. Therefore, the worker can easily decide whether or not a process, e.g., a plasma etching process, has been performed on the workpiece unit 101 in an environment at the predetermined temperature or higher by observing whether or not the discoloring layer 106C has discolored.

According to the present embodiment, the discoloring layer 106C discolors from the colorless state to the colored state in response to a temperature change to a predetermined temperature or higher. However, insofar as a color developed by the discoloring layer 106C when it discolors is known in advance, the discoloring layer 106C may discolor from one color to another different color. The temperature indicating ink or pigment may be mixed with the adhesive layer 6B, thereby allowing the adhesive layer 6B to function as a discoloring section. Alternatively, the temperature indicating ink or pigment may be contained in the base member 6A, thereby allowing the base member 6A to function as a discoloring section. The discoloring layer 106C is not limited to being positioned between the adhesive layer 6B and the base member 6A, but may be disposed on a lower surface of the base member 6A. According to the last-mentioned modification, the worker can observe whether or not the discoloring layer 106C has discolored from below the workpiece unit 101.

Figure 8:
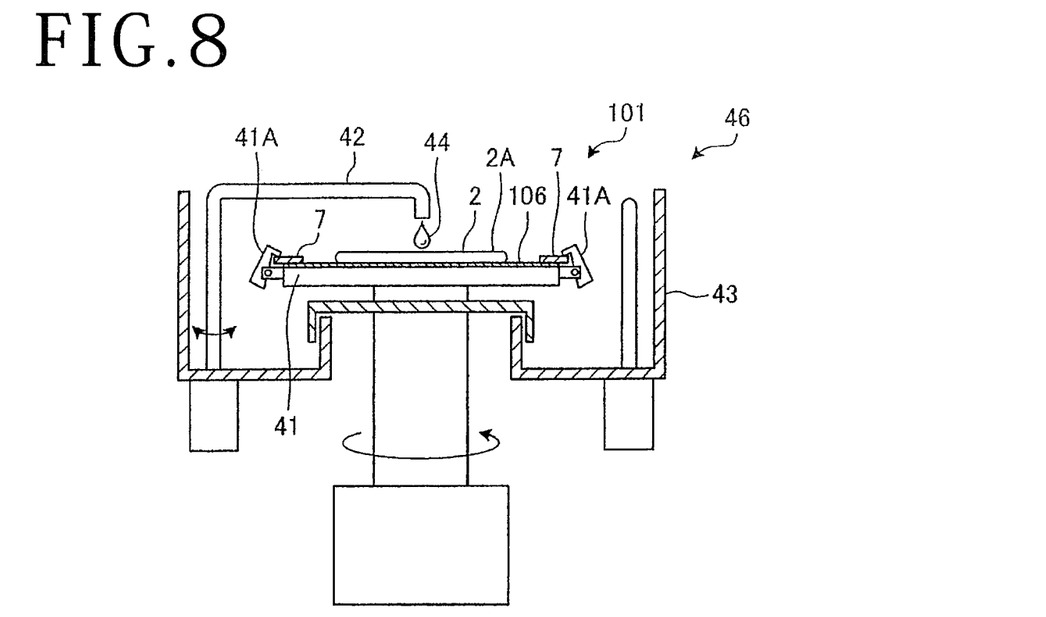
FIG. 8 is a cross-sectional view illustrating a step of forming a resin film on a face side of a wafer of the workpiece unit.
Figure 9:
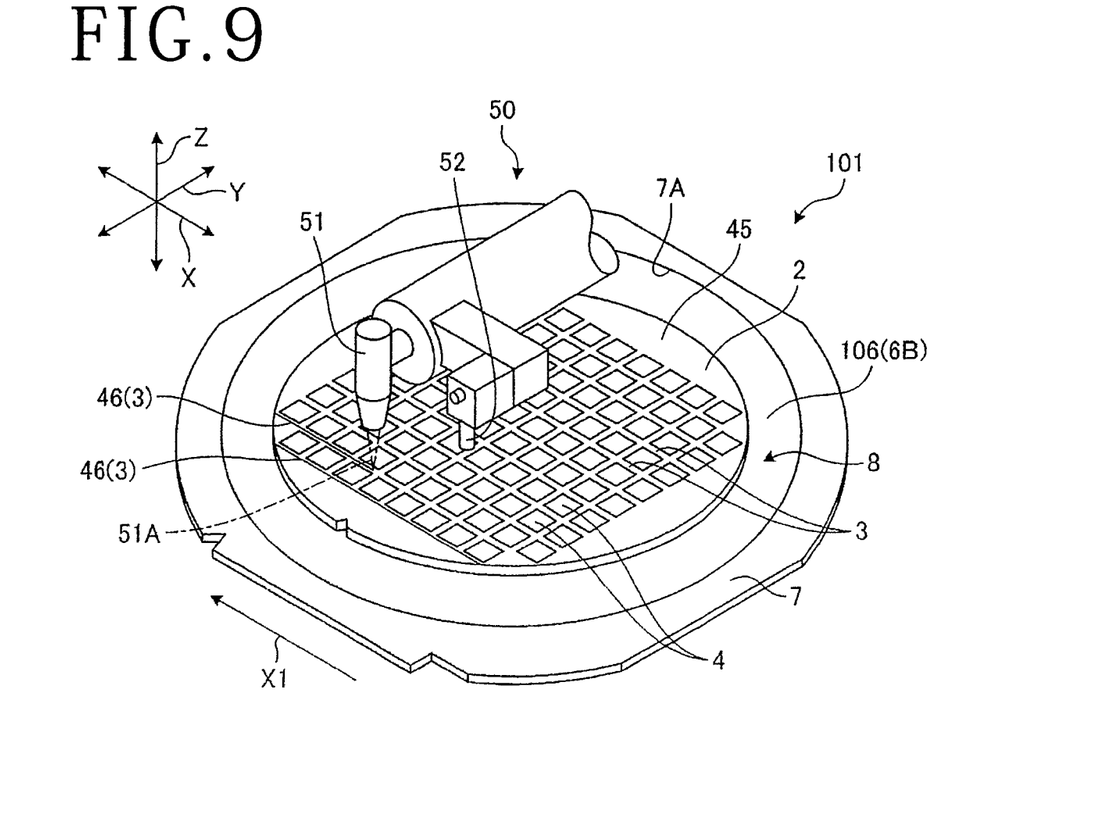
FIG. 9 is a perspective view illustrating a step of removing the resin film along projected dicing lines on the wafer of the workpiece unit.
Figure 10:
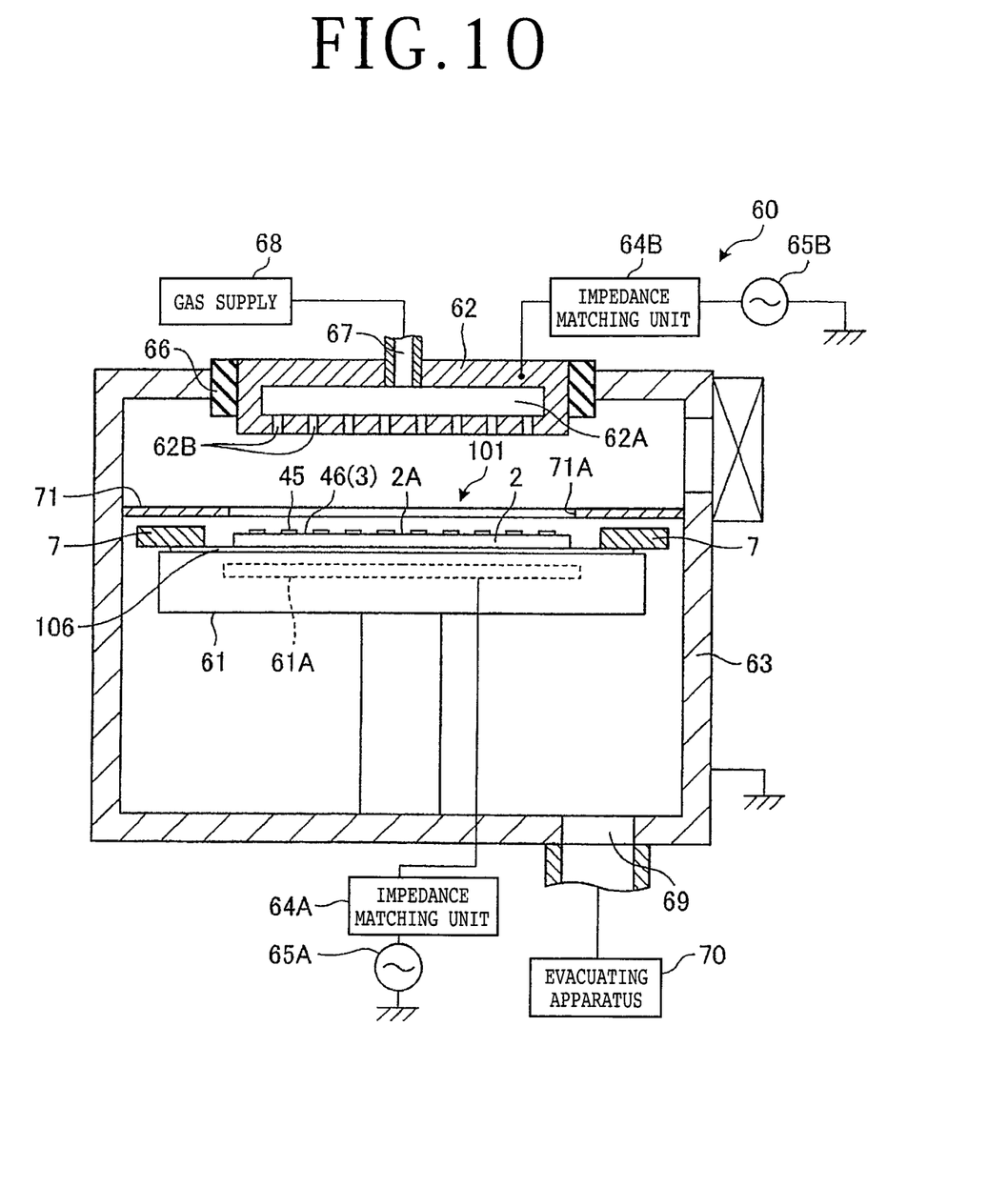
FIG. 10 is a cross-sectional view illustrating a step of performing a plasma etching process on the wafer of the workpiece unit.
Figure 11:
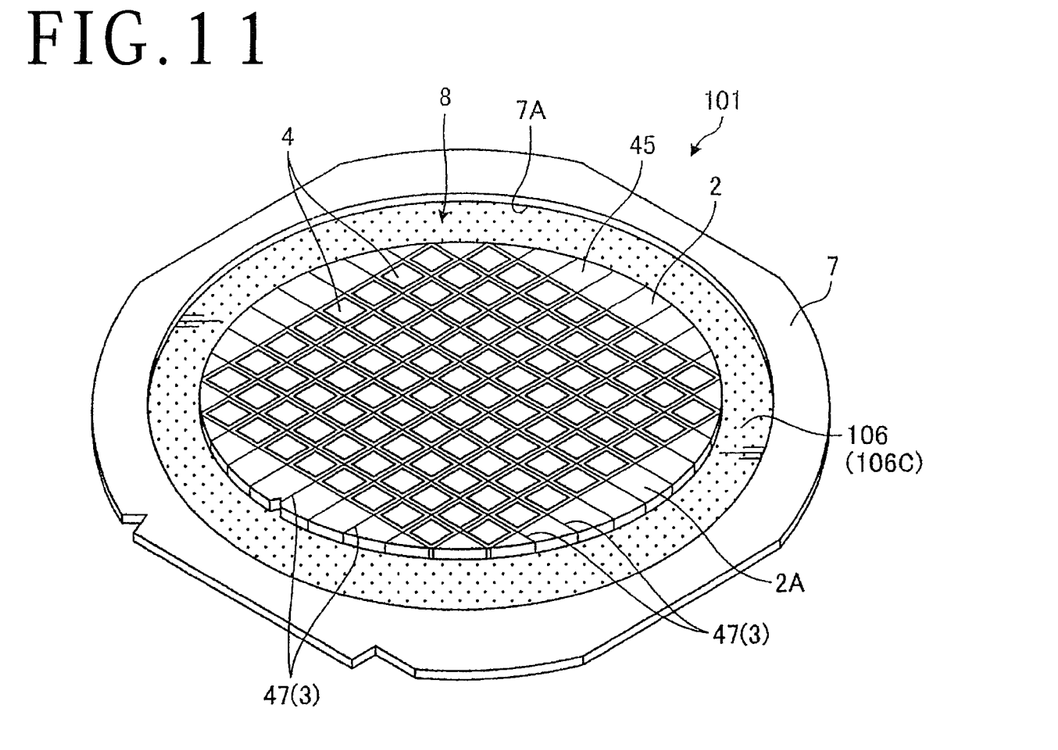
FIG. 11 is a perspective view of the workpiece unit after the plasma etching process.

A sequence of processing the workpiece unit 101 in which the wafer 2 is supported on the annular frame 7 by the tape 106 including the discoloring layer 106C will be described below. According to the present embodiment, the wafer 2 is divided into device chips by a plasma etching process that is also referred to as a plasma dicing process. FIG. 8 illustrates in cross section a step of forming a resin film on the face side of a wafer of the workpiece unit. FIG. 9 illustrates in perspective a step of removing the resin film along the projected dicing lines on the wafer of the workpiece unit. FIG. 10 illustrates in cross section a step of performing a plasma etching process on the wafer of the workpiece unit. FIG. 11 illustrates in perspective the workpiece unit after the plasma etching process.

First, the face side 2A of the wafer 2 is coated in its entirety with a resin film, i.e., a shield film, for example, by a resin film coating apparatus 40 illustrated in FIG. 8. The resin film coating apparatus 40 is in the form of a spin coater, i.e., a rotary coating apparatus, for example. The resin film coating apparatus 40 includes a chuck table 41 for holding the workpiece unit 101 thereon, the chuck table 41 being rotatable about a vertical axis along the Z directions, a nozzle 42 for supplying a liquid resin 44 onto the face side 2A of the wafer 2 of the workpiece unit 101 held on the chuck table 41, and a case 43 disposed around the chuck table 41 for preventing the liquid resin from scattering around. The chuck table 41 can hold the wafer 2 under suction thereon and has a plurality of clamps 41A for gripping the annular frame 7. The liquid resin 44 is a water-soluble resin, and is turned into a plasma-resistant resin film when hardened by being dried.

While the workpiece unit 101 is being held on the chuck table 41 such that the face side 2A of the wafer 2 faces upwardly, the liquid resin 44 is dropped at a predetermined rate from a nozzle 42 onto a central area of the face side 2A of the wafer 2. Then, the chuck table 41 is rotated about its own axis at a predetermined speed, causing the dropped liquid resin 44 to flow from the central area of the face side 2A of the wafer 2 radially outwardly toward an outer circumferential edge thereof under centrifugal forces. The liquid resin 44 thus spread over the face side 2A of the wafer 2 forms a resin film 45 (FIG. 9) having a substantially uniform thickness on the entire face side 2A of the wafer 2.

Thereafter, a laser processing apparatus 50 illustrated in FIG. 9 removes the resin film 45 along the projected dicing lines 3 on the wafer 2. The laser processing apparatus 50 includes an irradiating head 51 for applying a laser beam 51A to the wafer 2 and an image capturing unit 52 disposed alongside of the irradiating head 51 along the X directions. The irradiating head 51 includes a beam condenser, not illustrated, for converging a laser beam emitted from a laser oscillator, not illustrated, into the laser beam 51A. The irradiating head 51 adjusts a focused position of the laser beam 51A along the Z directions, i.e., vertical directions, as it is applied to the wafer 2. According to the present embodiment, the laser beam 51A applied by the irradiating head 51 is of a wavelength capable of performing an ablating process to remove the resin film 45 from the face side 2A of the wafer 2. The image capturing unit 52 is in the form of a camera for capturing an image representing the position of the wafer 2 with respect to the irradiating head 51 and the manner in which the wafer 2 is processed by the irradiating head 51.

The workpiece unit 101 is held on a chuck table, not illustrated. The chuck table is movable in the X directions. The chuck table is also rotatable about its own axis parallel to the vertical directions. According to the present embodiment, the chuck table for holding the workpiece unit 101 thereon is movable along the X directions. However, the laser processing apparatus 50 may be movable along the X directions insofar as it is movable relatively to the workpiece unit 101 along the X directions.

The laser processing apparatus 50 operates as follows: The image capturing unit 52 captures an image of the face side 2A of the wafer 2. After having identified the position of a projected dicing line 3 based on the captured image, the irradiating head 51 applies the laser beam 51A to the wafer 2 along the projected dicing line 3 which the chuck table is being processing-fed in the X1 direction. The laser beam 51A performs an ablating process on the wafer 2 along the projected dicing line 3 to form a processed groove 46 in the wafer 2, thereby removing the resin film 45 along the projected dicing line 3. The ablating process is repeatedly performed on the wafer 2 along all the projected dicing lines 3 to remove the resin film 45 along all the projected dicing lines 3.

Then, a plasma etching apparatus 60 illustrated in FIG. 10 performs a plasma etching process on the face side 2A of the wafer 2, forming etched grooves in the wafer 2 along the projected dicing lines 3 to a depth corresponding to a finished thickness of the wafer 2. The plasma etching apparatus 60 includes an electrostatic chuck (ESC) 61 for holding the workpiece unit 101 thereon, a gas ejection head 62 for ejecting a gas, and a chamber 63 accommodating therein the electrostatic chuck 61 and the gas ejection head 62.

The electrostatic chuck 61 is made of a ceramics such as alumina or a dielectric material such as titanium oxide. The electrostatic chuck 61 includes an electrode 61A disposed therein as a metal plate or the like that generates electric charges when a voltage is applied thereto. The electrode 61A is electrically connected through an impedance matching unit 64A to a bias high-frequency power supply 65A. When the bias high-frequency power supply 65A applies a direct current (DC) voltage through the impedance matching unit 64A to the electrode 61A, the electrode 61A generates an electrostatic attractive force due to polarization of electric charges between a holding surface of the electrostatic chuck 61 and the workpiece unit 101 to hold the workpiece unit 101 on the holding surface of the electrostatic chuck 61.

The gas ejection head 62 is vertically movably supported in an upper portion of the chamber 63 by a bearing 66. The gas ejection head 62 has a gas diffusion space 62A defined therein. A gas inlet port 67 is held in fluid communication with an upper portion of the gas diffusion space 62A. A gas supply 68 is connected through a gas pipe to the gas inlet port 67. The gas supply 68 stores an etching gas and a rare gas therein. The gas ejection head 62 also has a plurality of gas outlet ports 62B held in fluid communication with a lower portion of the gas diffusion space 62A and being open downwardly toward the electrostatic chuck 61. The gas ejection head 62 is electrically connected through an impedance matching unit 64B to a high-frequency power supply 65B. When the bias high-frequency power supply 65B applies high-frequency electric power through the impedance matching unit 64B to the gas ejection head 62, the gas ejection head 62 turns a gas supplied from the gas supply 68 through the gas inlet port 67 into the gas diffusion space 62A and discharged from the gas outlet ports 62B into a plasma.

A discharge pipe 69 is connected to a lower portion of the chamber 63. An evacuating apparatus 70 is connected to the discharge pipe 69. When the evacuating apparatus 70 is actuated, the chamber 63 is evacuated to reduce the pressure therein to a predetermined vacuum. A frame heating prevention guide 71 is disposed between the electrostatic chuck 61 and the gas ejection head 62 in the chamber 63. The frame heating prevention guide 71 is in the form of an annular member disposed above the annular frame 7 of the workpiece unit 101 held on the electrostatic chuck 61, and has an opening 71A defined centrally therein. The opening 71A is larger in size than the wafer 2. The plasma etching apparatus 60 also includes a controller, not illustrated, that controls various conditions including rates at which the gases are discharged from the gas ejection head 62, times for which the gases are discharged from the gas ejection head 62, high-frequency electric power, etc.

For performing a plasma etching process, the workpiece unit 101 is placed on the electrostatic chuck 61 with the face side 2A of the wafer 2 facing upwardly. Then, the high-frequency power supply 65B supplies high-frequency electric power to the gas ejection head 62, and the bias high-frequency power supply 65A applies a DC voltage to the electrode 61A, causing dielectric polarization between the holding surface of the electrostatic chuck 61 and the workpiece unit 101. An electrostatic attractive force is thus generated between the holding surface of the electrostatic chuck 61 and the workpiece unit 101 to hold the workpiece unit 101 on the holding surface of the electrostatic chuck 61.

The evacuating apparatus 70 is actuated to evacuate the chamber 63 to reduce the pressure therein to a predetermined vacuum, and then establish a closed space in the chamber 63. The etching gas stored in the gas supply 68 is led through the gas pipe and the gas inlet port 67 into the gas diffusion space 62A, from which the etching gas is ejected through the gas outlet ports 62B toward the wafer 2. As the etching gas is introduced into the chamber 63 while the high-frequency electric power is being applied from the high-frequency power supply 65B to the gas ejection head 62, a high-frequency electric field is developed between the gas ejection head 62 and the electrostatic chuck 61 to turn the etching gas into a plasma.

According to the present embodiment, the plasma etching apparatus 60 performs a Bosch process for performing a plasma etching process on the wafer 2 by alternately ejecting an $SF_6$ gas and a $C_4F_8$ gas as the etching gas into the chamber 63. According to the Bosch process, a plasma $SF_6$ gas is initially supplied to the wafer 2. The supplied plasma $SF_6$ gas etches the wafer 2 thicknesswise along the projected dicing lines 3 where the resin film 45 has been removed by the processed grooves 46 as illustrated in FIG. 10, thereby forming etched grooves in the wafer 2 along the projected dicing lines 3. At this time, those areas of the wafer 2 that are covered with the resin film 45 are not etched. Then, instead of the plasma $SF_6$ gas, a plasma $C_4F_8$ gas is supplied to the wafer 2. The supplied plasma $C_4F_8$ gas deposits a film on inner side surfaces and bottoms of the etched grooves. Thereafter, a plasma $SF_6$ gas is again supplied to the wafer 2 to etch away the film on the bottoms of the etched grooves, thereby deepening the etched grooves thicknesswise of the wafer 2. The plasma etching process thus performed produces etched grooves in the wafer 2 that are so deep as to reach the finished thickness of the wafer 2 along the projected dicing lines 3.

An etched grooves, denoted by 47 in FIG. 11, are formed in the wafer 2 by the plasma etching process as narrow grooves each having a width ranging from approximately 10 to 20 µm. When the plasma etching process is finished, the workpiece unit 101 is usually automatically placed back into a cassette, not illustrated. Consequently, the worker finds it difficult to decide whether or not the plasma etching process has been carried out on the wafer 2 visually from the appearance of the wafer 2.

It has been known in the art that during the plasma etching process, the wafer 2 is heated to a temperature, e.g., approximately 40° C., that is higher than normal temperature. According to the present embodiment, the tape 106 of the workpiece unit 101 includes the discoloring layer 106C including the temperature indicating ink that discolors in response to a temperature change, i.e., an external stimulus. As illustrated in FIG. 11, the discoloring layer 106C includes the temperature indicating ink that irreversibly discolors when heated to a predetermined temperature, e.g., 35° C., or higher during the plasma etching process. Therefore, the worker can easily decide whether or not the workpiece unit 101 has been placed in a heating environment, i.e., the plasma etching process has been performed on the workpiece unit 101 from the appearance of the workpiece unit 101 by observing whether or not the discoloring layer 106C has discolored.

According to the present embodiment, furthermore, since mainly the annular area 8 of the tape 106 discolors, the worker can easily decide whether or not the plasma etching process has been performed on the workpiece unit 101 from the appearance of the workpiece unit 101 even in a case where the workpiece unit 101 is placed in the cassette, not illustrated. Because the worker can decide that the plasma etching process that involves a temperature change, i.e., an external stimulus, has been performed on the workpiece unit 101 if at least the annular area 8 of the tape 106 has discolored, the worker can send the workpiece unit 101 to a next step, e.g., a reverse side grinding step, after having washed away the resin film 45 covering the face side 2A with water.

If the annular area 8 of the tape 106 has not discolored, then the worker can decide that no plasma etching process has been performed on the workpiece unit 101. Accordingly, the worker is prevented to send the workpiece unit 101 to a next step.

Figure 12:
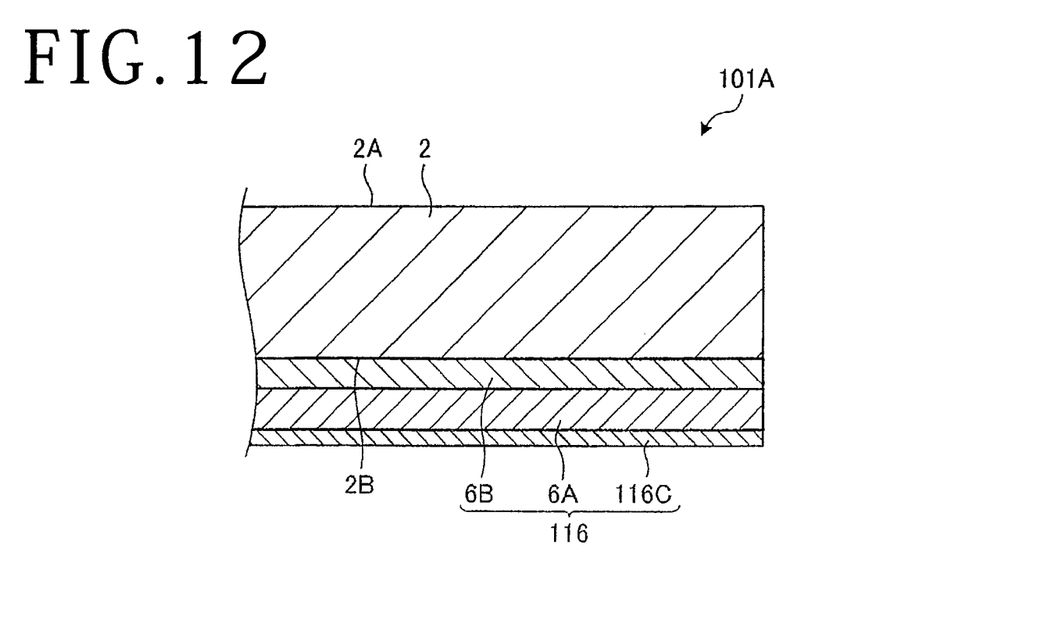
FIG. 12 is a fragmentary cross-sectional view of a workpiece unit according to a modification of the second embodiment.

Next, a modification of the second embodiment will be described below. According to the second embodiment, the workpiece unit 101 includes the wafer 2, the tape 6, and the annular frame 7. According to the modification of the second embodiment, as illustrated in FIG. 12, a workpiece unit 101A is free of the annular frame, and includes the wafer 2 and a tape 116. The tape 116 is of a size substantially equivalent to the wafer 2 and is stuck to the reverse side 2B of the wafer 2. The tape 116 has the base member 6A and the adhesive layer 6B referred to above and also has a discoloring layer, i.e., discoloring section, 116C stacked on the lower surface of the base member 6A. The discoloring layer 116C contains the temperature indicating ink referred to above. Since the tape 116 is of a size substantially equivalent to the wafer 2, the adhesive layer 6B is not exposed. As the discoloring layer 116C is disposed on the lower surface of the base member 6A, when the workpiece unit 101A is subjected to a temperature change, i.e., an external stimulus, the lower surface of the tape 116 discolors. Therefore, the worker can easily decide whether or not the plasma etching process that involves a temperature change has been performed on the workpiece unit 101A from the appearance of the workpiece unit 101A by observing whether or not the tape 116 has discolored.

Third Embodiment

Figure 13:
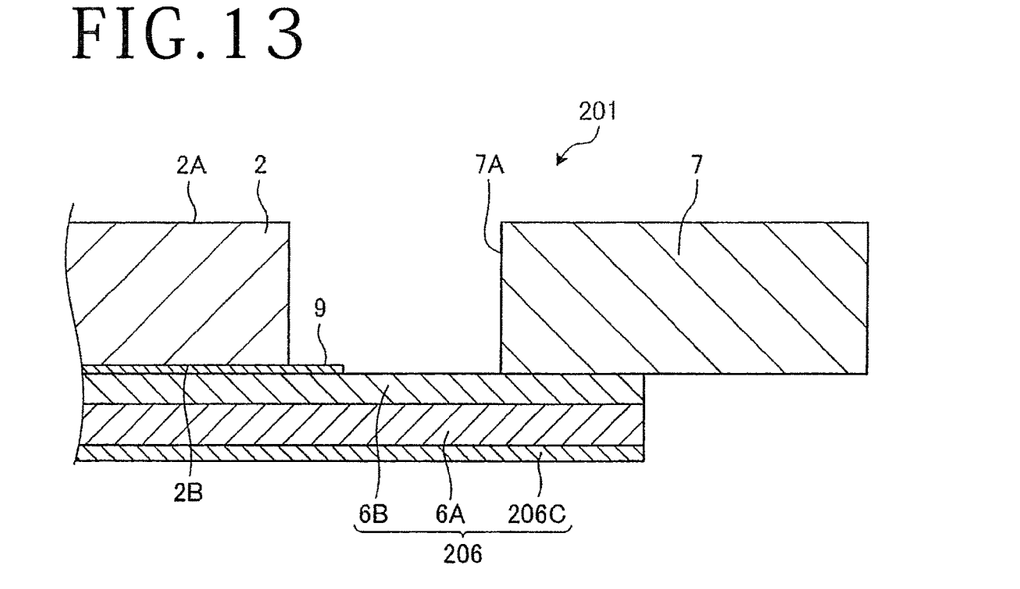
FIG. 13 is a fragmentary cross-sectional view of a workpiece unit according to a third embodiment of the present invention.

FIG. 13 illustrates in fragmentary cross section a workpiece unit 201 according to a third embodiment of the present invention. Those parts of the workpiece unit 201 which are identical to those of the workpiece unit 1 according to the first embodiment are denoted by identical reference characters, and will not be described in detail below. As illustrated in FIG. 13, the workpiece unit 201 includes a tape 206 stuck to the wafer 2 and supports the wafer 2 on the annular frame 7, and also includes a die-attach film (hereinafter referred to as "DAF") 9 interposed between the wafer 2 and the tape 206. The DAF 9 is in the form of a film-like adhesive member for die bonding, and is stacked on the adhesive layer 6B of the tape 206.

According to the present embodiment, the workpiece unit 201 is fabricated by sticking the tape 206 with the DAF 9 to the reverse sides of the wafer 2 and the annular frame 7. In order to stick the DAF 9 and the wafer 2 firmly to each other, the tape 206 with the DAF 9 is stuck to the wafer 2 and the annular frame 7 while they are being heated. If the wafer 2 is not heated sufficiently, then the tape 206 with the DAF 9 may fail to stick firmly to the wafer 2. It is difficult for the worker to decide whether or not the tape 206 with the DAF 9 is properly stuck to the wafer 2 and the annular frame 7 from their appearance. The workpiece unit 201 according to the present embodiment allows the worker to decide how the tape 206 with the DAF 9 is stuck to the wafer 2 and the annular frame 7 from the appearance of the tape 206.

The tape 206 of the workpiece unit 201 includes the base member 6A made of synthetic resin, the adhesive layer, i.e., glue layer, 6B stacked on the upper surface of the base member 6A, and a discoloring layer, i.e., discoloring section, 206C stacked on the lower surface of the base member 6A. According to the present embodiment, the discoloring layer 206C contains a first temperature indicating ink that discolors from a colorless state to a first color when it reaches a predetermined first temperature, e.g., 50° C., and a second temperature indicating ink that discolors from a colorless state to a second color, which is different from the first color, when it reaches a predetermined second temperature, e.g., 70° C., different from or higher than the first temperature. Each of the first temperature indicating ink and the second temperature ink is dispersed in the discoloring layer 206C in its entirety. Each of the first temperature indicating ink and the second temperature ink irreversibly discolors and hence the first and second colors developed respectively by the first and second temperature indicating inks when they have discolored cannot be undone. With the discoloring layer 206C thus arranged, the worker can easily decide whether or not a heating process has been performed on the workpiece unit 201 and also an approximate temperature to which the workpiece unit 201 has been heated from the appearance of the discoloring layer 206C by observing which of the first color and the second color, which includes a color representing a mixture between the first color and the second color, the discoloring layer 206C has discolored to. According to the present embodiment, the discoloring layer 206C discolors from the colorless state to the colored state in response to a temperature change. However, insofar as a color developed by the discoloring layer 206C when it discolors is known in advance, the discoloring layer 206C may discolor from one color to another different color.

Figure 14:
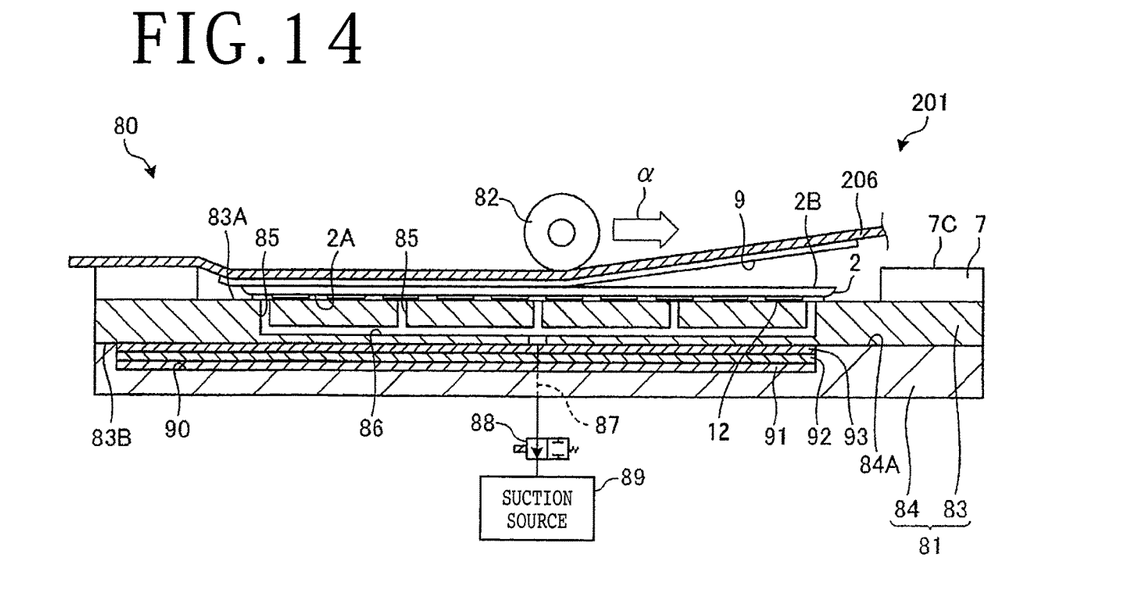
FIG. 14 is a cross-sectional view illustrating a step of sticking a tape to a wafer and an annular frame.
Figure 15:
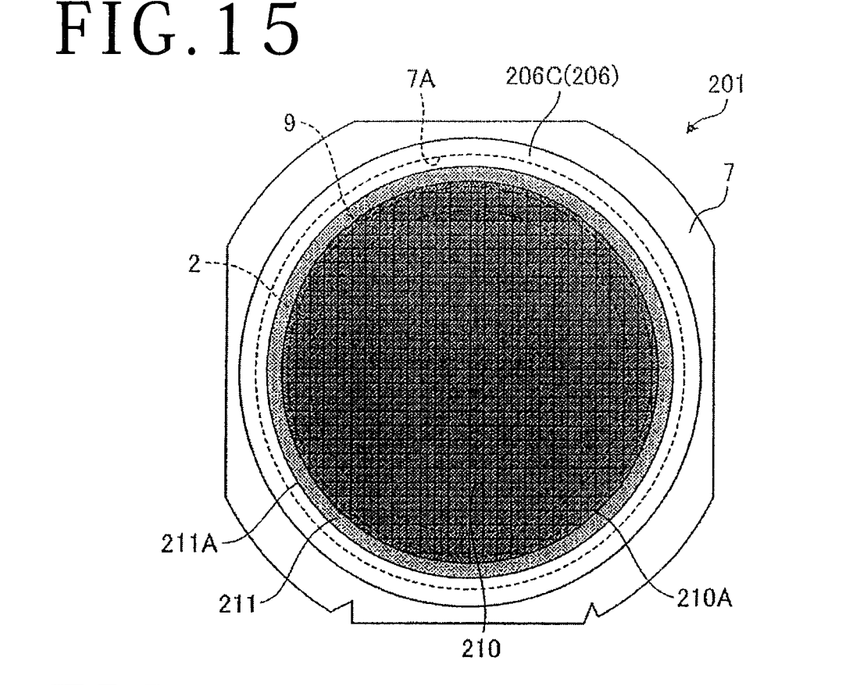
FIG. 15 is a bottom view of the workpiece unit with the tape normally stuck thereto.
Figure 16:
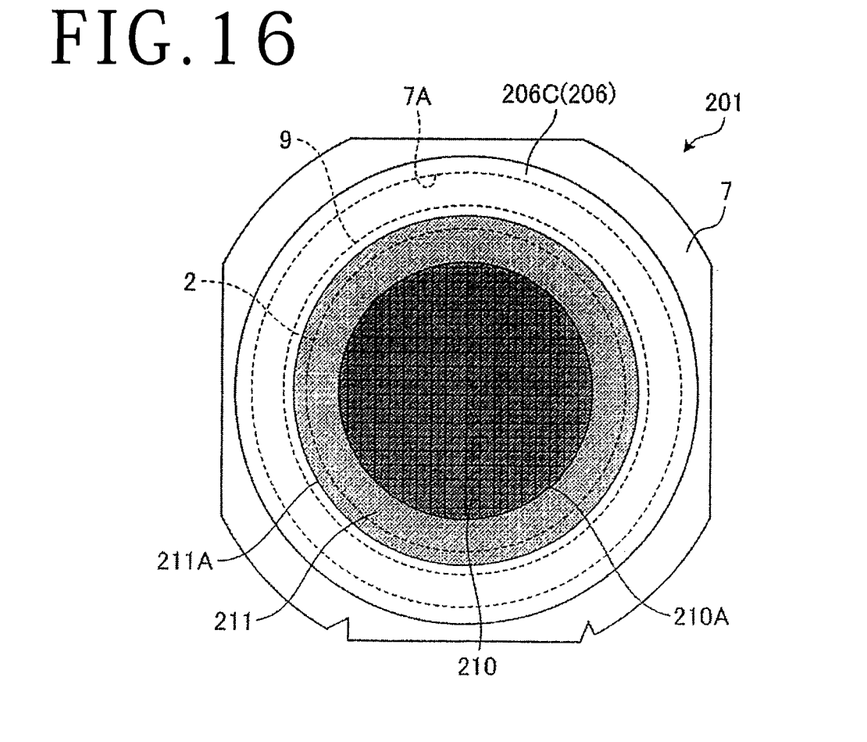
FIG. 16 is a bottom view of the workpiece unit with the tape not normally stuck thereto.

Next, a sequence of sticking the tape 206 with the DAF 9 to the wafer 2 and the annular frame 7 will be described below. FIG. 14 illustrates in cross section a step of sticking a tape to a wafer and an annular frame. FIG. 15 illustrates in bottom view the workpiece unit with the tape normally stuck thereto. FIG. 16 illustrates in bottom view the workpiece unit with the tape not normally stuck thereto.

The tape 206 with the DAF 9 is stuck to the wafer 2 and the annular frame 7 by a tape sticking apparatus 80 illustrated in FIG. 14. The tape sticking apparatus 80 includes a heating table 81 and a sticking roller 82.

The heating table 81 includes a holder 83 and a heating member 84 that are stacked one on the other. The holder 83 is made of a material of excellent heat conductivity, e.g., metal or the like, and has a holding surface 83A for holding the wafer 2 thereon. A protective tape 12 is stuck to the face side 2A of the wafer 2. The wafer 2 is placed on the holding surface 83A with the protective tape 12 interposed therebetween. The holding surface 83A has a plurality of suction holes 85 defined therein. The suction holes 85 are held in fluid communication with a fluid communication channel 86 defined in the holder 83 and connected through a suction channel 87 and a solenoid-operated on-off valve 88 to a suction source 89.

The heating member 84 has a cavity 90 defined in an upper surface 84A thereof that is held in contact with a lower surface 83B of the holder 83. The cavity 90 houses therein a heat insulator 91, a heater 92, and an aluminum plate 93 that are stacked together. The aluminum plate 93 is a heat conductor for transferring heat of the heater 92 to the holder 83. The aluminum plate 93 lies flush with the upper surface 84A of the heating member 84 and held in contact with the lower surface 83B of the holder 83. The heater 92 is an electric heater, for example, that converts electric energy to heat energy when an electric current flows through the heater 92. According to the present embodiment, the tape sticking apparatus 80 includes a temperature sensor, not illustrated, for detecting the temperature of the holder 83, for example. The value of the electric current flowing through the heater 92 is controlled so that the temperature detected by the temperature sensor reaches a predetermined temperature.

The sticking roller 82 rolls over the heating table 81 in a predetermined direction indicated by an arrow α to stick the tape 206 with the DAF 9 to the reverse side 2B of the wafer 2 and a reverse side 7C of the annular frame 7. The tape sticking apparatus 80 further includes a cutter mechanism, not illustrated, that cuts the tape 206 into a circular shape having a predetermined size after the tape 206 has been stuck to the wafer 2 and the annular frame 7.

For sticking the tape 206 to the wafer 2 and the annular frame 7, the wafer 2 is placed on the heating table 81 with the protective tape 12 interposed therebetween, and the annular frame 7 is placed on the heating table 81 around the wafer 2. Then, the suction source 89 is actuated to hold the wafer 2 under suction on the holding surface 83A of the holder 83 through a vacuum acting through the suction holes 85. The heater 92 of the heating member 84 is energized to heat the holder 83 through the aluminum plate 93. Since heat of the heater 92 is transmitted through the protective tape 12 to the wafer 2, the wafer 2 is also heated.

Then, the tape 206 with the DAF 9 is placed on the reverse side 2B of the wafer 2, and the sticking roller 82 rolls on the tape 206 in the predetermined direction indicated by the arrow α. The tape 206 with the DAF 9 is now stuck to the reverse side 2B of the wafer 2 and the reverse side 7C of the annular frame 7 that are held on the heating table 81.

According to the present embodiment, the tape 206 of the workpiece unit 201 contains the first temperature indicating ink that discolors to the first color when it reaches the predetermined first temperature in response to a temperature change, i.e., an external stimulus, and the second temperature indicating ink that discolors to the second color when it reaches the predetermined second temperature higher than the first temperature in response to a temperature change, i.e., an external stimulus. It has been empirically found that the wafer 2 and the tape 206 with the DAF 9 have their adhesive power increased and are firmly stuck to each other when they reach a predetermined sticking temperature, e.g., 60° C. Therefore, the second temperature, e.g., 70° C., is set to a value higher than the sticking temperature, and the first temperature, e.g., 50° C., is set to a value lower than the sticking temperature.

Consequently, the worker can easily decide whether or not the tape 206 with the DAF 9 has been stuck in a heating environment, i.e., whether or not the wafer 2 and the tape 206 with the DAF 9 have been firmly stuck to each other, from the appearance of the workpiece unit 201 by observing whether or not the tape 206 has discolored and the sizes of discolored areas. Specifically, as illustrated in FIG. 15, if an outer edge 210A of an area 210 that has discolored to the second color and an outer edge 211A of an area 211 that has discolored to the first color have extended radially outwardly beyond the DAF 9, then the worker can decide that at least the DAF 9 has been heated to a temperature equal to or higher than the second temperature and that the wafer 2 and the tape 206 with the DAF 9 have been firmly stuck to each other.

On the other hand, as illustrated in FIG. 16, if the area 211 that has discolored to the first color remains positioned radially inwardly within the DAF 9, then the worker can decide that the wafer 2 may have not been heated sufficiently and the tape 206 with the DAF 9 may have failed to stick firmly to the wafer 2 as the overall DAF 9 has not been heated to a temperature equal to or higher than the second temperature. In a case where the wafer 2 has not been heated sufficiently, the worker heats the wafer 2 again to eliminate the possibility that the tape 206 with the DAF 9 may have failed to stick firmly to the wafer 2.

Figure 17:
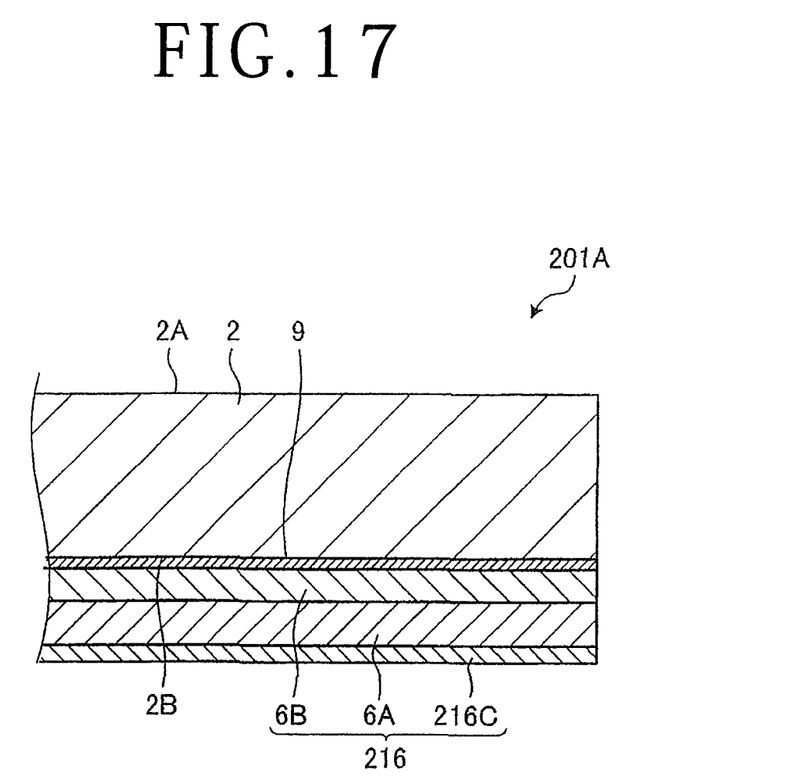
FIG. 17 is a fragmentary cross-sectional view of a workpiece unit according to a modification of the third embodiment.

Next, a modification of the third embodiment will be described below. According to the third embodiment, the workpiece unit 201 includes the wafer 2, the tape 206, and the annular frame 7. According to the modification of the third embodiment, as illustrated in FIG. 17, a workpiece unit 201A is free of the annular frame, and includes the wafer 2 and a tape 216 with the DAF 9. The tape 216 with the DAF 9 is of a size substantially equivalent to the wafer 2 and is stuck to the reverse side 2B of the wafer 2. The tape 216 has the base member 6A and the adhesive layer 6B referred to above and also has a discoloring layer, i.e., discoloring section, 216C stacked on the lower surface of the base member 6A. The discoloring layer 216C contains the first temperature indicating ink and the second temperature indicating ink referred to above. According to the present modification, the worker can easily decide whether or not a heating process has been performed on the workpiece unit 201A and also an approximate temperature to which the workpiece unit 201A has been heated from the appearance of the discoloring layer 216C by observing which of the first color and the second color, which includes a color representing a mixture between the first color and the second color, the discoloring layer 216C has discolored to.

According to the embodiments of the present invention, since the ultraviolet radiation detecting seal 10 or the discoloring layer 106C or 206C that functions as the irreversible discoloring section that discolors in response to an ultraviolet radiation application or a temperature change as an external stimulus is included in at least one of the tape 6, 106, or 206 and the annular frame 7, it can easily be decided whether or not a process that involves an external stimulus has been performed on the workpiece unit from the appearance thereof.

According to the modifications of the above embodiments, since the discoloring layer 16C, 116C, or 216C that functions as the irreversible discoloring section that discolors in response to an ultraviolet radiation application or a temperature change as an external stimulus is included in the tape 16, 116, or 216, it can easily be decided whether or not a process that involves an external stimulus has been performed on the workpiece unit from the appearance thereof.

The present invention is not limited to the above embodiments and modifications. The embodiments and modifications may be changed or modified within the scope of the invention. In the first embodiment, the ultraviolet radiation detecting seal 10 that irreversibly discolors when irradiated with the ultraviolet radiation is stuck to the reverse side 7B of the annular frame 7. Instead, a temperature indicating tape, not illustrated, that discolors in response to a temperature change may be stuck to the face side or reverse side 7B of the annular frame 7 for the worker to decide whether or not a heating process has been performed on the workpiece unit. The temperature indicating tape may contain the temperature indicating ink or the first temperature ink and the second temperature indicating ink referred to above. Instead of the temperature indicating tape, the face side or reverse side 7B of the annular frame 7 may be coated partly or entirely with a temperature indicating ink which may be the temperature indicating ink or the first temperature ink and the second temperature indicating ink referred to above.

In the second embodiment, the plasma etching process is illustrated as a wafer processing process. However, the present invention is not limited to such a detail. According to another wafer processing process, a laser beam may be applied to the wafer 2 along the projected dicing lines 3 to perform an ablating process or a modified layer forming process on the wafer 2. In such a laser processing process, since the tape is subjected to a temperature change, i.e., the tape is heated, it can easily be decided whether or not the laser processing process that involves an external stimulus has been performed on the workpiece unit from the appearance thereof.

In the first through third embodiments described above, a dicing tape is illustrated as the tape. However, the present invention is not limited to such a detail. Rather, a BG tape that is stuck to the face side of the wafer to protect the devices thereon may be used as the tape. For peeling off the BG tape from the wafer, the BG tape is heated to approximately 60° C. through the wafer by a heater table. After the BG tape is softened by the heat, it is peeled off from the wafer.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A workpiece unit comprising:
a workpiece;
a tape stuck to the workpiece; and
an annular frame to which an outer circumferential edge of the tape is stuck and which has an opening defined centrally therein,
the workpiece being disposed in the opening in the annular frame and supported on the annular frame by the tape,
wherein at least one of the tape and the annular frame has an irreversible discoloring section that discolors in response to an external stimulus, and
wherein the irreversible discoloring section comprises an ultraviolet ink that irreversibly discolors when irradiated with ultraviolet radiation.

2. The workpiece unit according to claim 1, wherein the tape discolors in its entirety in response to the external stimulus.

3. The workpiece unit according to claim 1, wherein the tape includes a base member and a glue layer, and the glue layer is hardened when irradiated with an ultraviolet radiation as the external stimulus.

4. The workpiece according to claim 1, wherein the ultraviolet ink is applied to at least a portion of the annular frame.

5. The workpiece according to claim 1, wherein the ultraviolet ink is interposed between a base layer and an adhesive layer of the tape.

6. The workpiece according to claim 1, wherein the ultraviolet ink is incorporated into an adhesive layer of the tape.

7. The workpiece unit according to claim 1, wherein the ultraviolet ink discolors in response to being irradiated with ultraviolet radiation having a wavelength of between 300 nm and 400 nm.

8. A workpiece unit comprising:
a workpiece;
a tape stuck to the workpiece;
an annular frame to which an outer circumferential edge of the tape is stuck and which has an opening defined centrally therein; and
an annular area defined between an outer circumferential edge of the workpiece and an inner circumferential edge of the annular frame, wherein the tape is exposed at the annular area;
wherein the workpiece is disposed in the opening in the annular frame and supported on the annular frame by the tape,
wherein the tape has an irreversible discoloring section that discolors in response to an external stimulus, and
wherein the irreversible discoloring section is visible in the annular area between the outer circumferential edge of the workpiece and the inner circumferential edge of the annular frame to alert a user whether or not a process has been performed upon the workpiece unit.

9. The workpiece unit according to claim 8, wherein the external stimulus is a temperature change.

10. The workpiece unit according to claim 8, wherein the external stimulus is a temperature change, and the discoloring section discolors to a first color at a first temperature and discolors to a second color different from the first color at a second temperature different from the first temperature.

11. A workpiece unit comprising:
a workpiece;
a tape stuck to the workpiece;
an annular frame to which an outer circumferential edge of the tape is stuck and which has an opening defined centrally therein, wherein the workpiece is disposed in the opening in the annular frame and is supported on the annular frame by the tape; and
an ultraviolet radiation detecting seal affixed to a portion of the annular frame between the outer circumferential edge of the tape and an outer circumferential edge of the annular frame,
wherein the ultraviolet radiation detecting seal discolors in response to being irradiated with ultraviolet radiation.

12. The workpiece unit according to claim 11, wherein the ultraviolet radiation detecting seal discolors in response to being irradiated with ultraviolet radiation having a wavelength of between 300 nm and 400 nm.

13. The workpiece unit according to claim 11, wherein the ultraviolet radiation detecting seal comprises an adhesive layer, a base layer, and a discoloring layer, wherein the discoloring layer discolors when irradiated with ultraviolet radiation.

14. The workpiece unit according to claim 13, wherein the discoloring layer comprises an ultraviolet ink.

* * * * *